(12) United States Patent
Blanchard et al.

(10) Patent No.: US 6,369,426 B2
(45) Date of Patent: *Apr. 9, 2002

(54) TRANSISTOR WITH INTEGRATED PHOTODETECTOR FOR CONDUCTIVITY MODULATION

(75) Inventors: Richard A. Blanchard, Los Altos; David L. Whitney, San Jose, both of CA (US)

(73) Assignee: Infineon Technologies North America Corp., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/560,658

(22) Filed: Apr. 27, 2000

(51) Int. Cl.[7] .................. H01L 29/76; H01L 29/94; H01L 31/062; H01L 31/113; H01L 31/119
(52) U.S. Cl. .................. 257/342; 257/292; 257/290; 257/336; 257/337; 257/343
(58) Field of Search ........................ 257/290, 292, 257/328, 335, 336, 337, 342, 343, 344

(56) References Cited

U.S. PATENT DOCUMENTS

| | | | |
|---|---|---|---|
| 4,831,423 A | 5/1989 | Shannon | 357/23.4 |
| 4,952,992 A | 8/1990 | Blanchard | 357/23.4 |
| 5,142,342 A | 8/1992 | Stein | |
| 5,430,321 A | 7/1995 | Effelsberg | 257/463 |
| 5,514,608 A | 5/1996 | Williams et al. | 437/44 |
| 5,623,151 A * | 4/1997 | Ajit | 257/212 |
| 5,838,042 A | 11/1998 | Zambrano | 257/342 |
| 5,869,851 A | 2/1999 | Sugawa | |
| 5,939,742 A * | 8/1999 | Yiannoulos | 257/292 |

FOREIGN PATENT DOCUMENTS

| | | |
|---|---|---|
| JP | 04069976 | 3/1992 |

OTHER PUBLICATIONS

Y. Sugawara et al., *350V Carrier Injection Field Effect Transistor (CIFET) with Very Low On–Resistance and High Switching Speed*, International Symposium on Power Semiconductor Devices & ICs, p.450–454, May 23, 1995.

* cited by examiner

*Primary Examiner*—Ngan V. Ngo
(74) *Attorney, Agent, or Firm*—Fish & Richardson P.C.

(57) ABSTRACT

A semiconductor device and a method of modulating the conductivity of a DMOS transistor included in the device utilize photocurrent generated by a photodetector for minority-carrier injection. The injection of minority carriers into the DMOS transistor of the device reduces the on-resistance of the transistor. The semiconductor device may be used in an optocoupling application. In a first embodiment, the semiconductor device includes a lateral DMOS transistor, a minority-carrier injector, and a photodetector. In a preferred embodiment, the semiconductor device is an integrated device, such that the transistor, the injector and the photodetector are collectively formed on a single semiconductive substrate. The photodetector of the device includes at least one electrically isolated photodiode. As an example, the photodetector may include two dielectrically isolated photodiodes. The photodiodes are serially connected between the drain terminal of the transistor and the minority-carrier injector. The connection to the minority-carrier injector allows the photocurrent generated by the photodiodes to be transmitted to the injector to provide the current/voltage needed by the injector to introduce minority carriers into the transistor. The connection to the drain terminal ensures that the voltage applied to the injector, when the photodetector is generating photocurrent, is maintained at a higher voltage than the drain voltage applied to the drain terminal, even if the drain voltage is fluctuating. In a second embodiment, the semiconductor device includes a vertical DMOS transistor, instead of a lateral DMOS transistor.

21 Claims, 4 Drawing Sheets

TRANSISTOR WITH INTEGRATED PHOTODETECTOR FOR CONDUCTIVITY MODULATION

BACKGROUND OF THE INVENTION

The invention relates generally to metal-oxide-semiconductor transistors and more particularly to a double-diffused metal-oxide-semiconductor transistor that is conductivity-modulated by minority carrier injection.

DESCRIPTION OF THE RELATED ART

Double-diffused metal-oxide-semiconductor (DMOS) transistors are often used in high voltage and/or high current applications. The steady-state power dissipation of a DMOS transistor used as a switch is a function of both its on-resistance and the operating current. The power dissipation can be reduced by decreasing the on-resistance of the DMOS transistor. However, since MOS transistors are minority carrier devices, the on-resistance of a DMOS transistor is inversely proportional to its surface area. That is, any reduction in the on-resistance is, to the first order, proportional to the increase in surface area.

In FIG. 1, a conventional lateral DMOS transistor 10 is shown. The DMOS transistor includes a P-type substrate 12, a lightly doped N-type region 14, a heavily doped N-type source region 16, a heavily doped N-type drain region 18, and a P-type body region 20. The transistor further includes two metallization layers 22 and 24 and a gate 26, located within an insulation layer 28. The metallization layer 22 is positioned over the source and body regions 16 and 20, while the metallization layer 24 is positioned over the drain region 18. The transistor is a three terminal device. Therefore, various components of the lateral DMOS transistor are electrically connected to a gate terminal 30, a source-body terminal 32 and a drain terminal 34. The gate terminal 30 is electrically connected to the gate, which controls the conductive state of the transistor. The source-body terminal 32 is electrically connected to the source and body regions via the metallization layer 22, while the drain terminal 34 is electrically connected to the drain region via the metallization layer 24.

The voltage drop across a DMOS transistor, such as the lateral DMOS transistor 10, for a given current can be decreased by introducing minority carriers into the drift region of the device, e.g., the lightly doped N-type region 14. Several techniques have been proposed for introducing these minority carriers in a DMOS transistor structure.

One such technique is described in a paper entitled "350v Carrier Injection Field Effect Transistor (CIFET) with Very Low On-Resistance and High Switching Speed," by Sugawara et al., *Proceedings of the 7th International Symposium on Power Semiconductor Devices and ICs*, May 23–25, 1995. The paper describes a DMOS transistor that includes a P-type injector region near the drain of the transistor. The P-type injector region is connected to an extra terminal that can supply voltage (or current) to the P-type injector region. The supplied voltage induces the P-type injector region to inject minority carriers into the transistor, which reduces the on-resistance of the device. Although this technique can provide a significant reduction in the voltage drop across the device, there are concerns with the technique because of the difficult requirements that must be satisfied before the device can be successfully implemented.

One of the requirements that must be satisfied is that a fourth device lead is needed to supply voltage to the P-type injector region. In addition, the required voltage must be greater than the drain voltage to induce the P-type injector region to introduce minority carriers. Consequently, another requirement is that off-device circuitry is needed to provide this required voltage. Still another requirement is that the introduction of the minority carriers must be synchronized with the activation and deactivation of the device.

Other techniques are described in a number of U.S. patents. U.S. Pat. No. 4,831,423 to Shannon discloses a lateral DMOS transistor that includes a minority-carrier injector and at least one floating injector region located between the source and the drain. The floating injector region is intended to spread the minority-carrier injection from the vicinity of the minority-carrier injector into the body region of the device that is remote from the injector, so that conductivity modulation is provided in the remote body region. U.S. Pat. No. 4,952,992 to Blanchard, an inventor of the invention described herein, discloses a vertical DMOS transistor that utilizes a Schottky-barrier diode that functions as a minority-carrier injector. In several embodiments, the Schottky-barrier diode of the Blanchard transistor is electrically connected to the gate terminal to receive the voltage applied to that terminal in order to forward-bias the diode for minority-carrier injection. Thus, the transistor of Blanchard can be a three terminal device.

Although these devices operate well for their intended purposes, what is needed is a DMOS transistor structure having a minority-carrier injector that does not require an external voltage source to introduce minority carriers into the transistor.

SUMMARY OF THE INVENTION

A semiconductor device and a method of modulating the conductivity of a DMOS transistor included in the device utilize photocurrent generated by a photodetector for minority-carrier injection. The injection of minority carriers into the DMOS transistor of the device reduces the on-resistance of the transistor. The semiconductor device may be used in an optocoupling application.

In a first embodiment, the semiconductor device includes a lateral DMOS transistor, a minority-carrier injector, and a photodetector. In a preferred embodiment, the semiconductor device is an integrated device, such that the transistor, the injector and the photodetector are collectively formed on a single semiconductive substrate. The minority-carrier injector of the device is located near the drain region of the lateral DMOS transistor to introduce minority carriers into the drift region of the transistor. The minority-carrier injector is a P-type subregion of a lightly doped N-type region of the device.

The photodetector of the device includes at least one electrically isolated photodiode. As an example, the photodetector may include two dielectrically isolated photodiodes. The photodiodes are serially connected between the drain terminal of the transistor and the minority-carrier injector. The connection to the minority-carrier injector allows the photocurrent generated by the photodiodes to be transmitted to the injector to provide the current/voltage needed by the injector to introduce minority carriers into the transistor. The connection to the drain terminal ensures that the voltage applied to the injector, when the photodetector is generating photocurrent, is maintained at a higher voltage than the drain voltage applied to the drain terminal, even if the drain voltage is fluctuating. The photodiodes are formed in an area of the device that would otherwise be "wasted" by the drain of the DMOS transistor. The number of photodiodes included in the photodetector is not critical to the invention.

In a second embodiment, the semiconductor device includes a vertical DMOS transistor, instead of a lateral DMOS transistor. However, the structural configuration of the minority-carrier injector and the photodetector in the second embodiment may be identical to the first embodiment. For both embodiments, the operation of the semiconductor device with respect to conductivity modulation of the DMOS transistor is essentially the same.

A method of modulating the conductivity of a DMOS transistor of an integrated semiconductor device in accordance with the present invention includes providing incident light on the surface of a photodetector of the semiconductor device. The incident light may be provided by an LED that is positioned near the surface of the photodetector. Next, the photodiodes of the photodetector produce a photocurrent in response to the incident light. The photocurrent is then transmitted to a minority-carrier injector that is positioned near the DMOS transistor. The transmitted current creates a forward-bias condition that induces the injector to introduce minority carriers into a drift region of the DMOS transistor. The introduction of minority carriers within the drift region affects the conductivity of the DMOS transistor.

DETAILED DESCRIPTION

Figure 2:
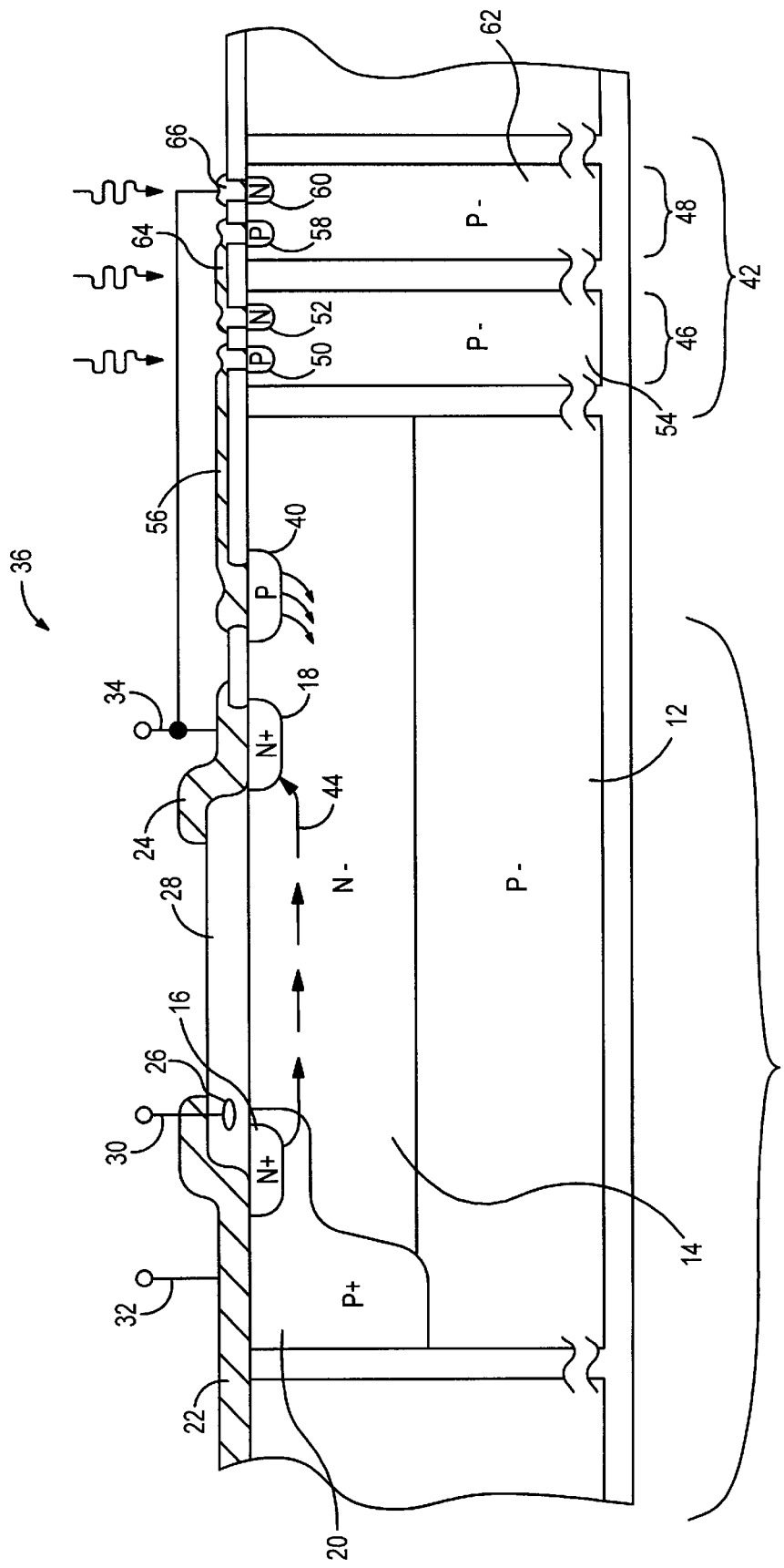
FIG. 2 is a cross-sectional view of a semiconductor device having a lateral DMOS transistor, a minority-carrier injector and an integrated photodetector in accordance with a first embodiment of the present invention.

With reference to FIG. 2, a semiconductor device 36 in accordance with a first embodiment is shown. The semiconductor device includes a lateral DMOS transistor 38, a minority-carrier injector 40 and an integrated photodetector 42. The photodetector is electrically connected to the minority-carrier injector to forward-bias the injector when the photodetector is generating photocurrent in response to incident light. The forward-bias condition of the minority-carrier injector induces the injector to introduce minority carriers into the lateral DMOS transistor, thereby reducing the on-resistance of the transistor. The utilization of the integrated photodetector eliminates the need to supply voltage to the minority-carrier injector from an external voltage source through an extra terminal. Thus, the semiconductor device operates as a three terminal device. The semiconductor device 36 may be used in an optocoupling application.

Figure 1:
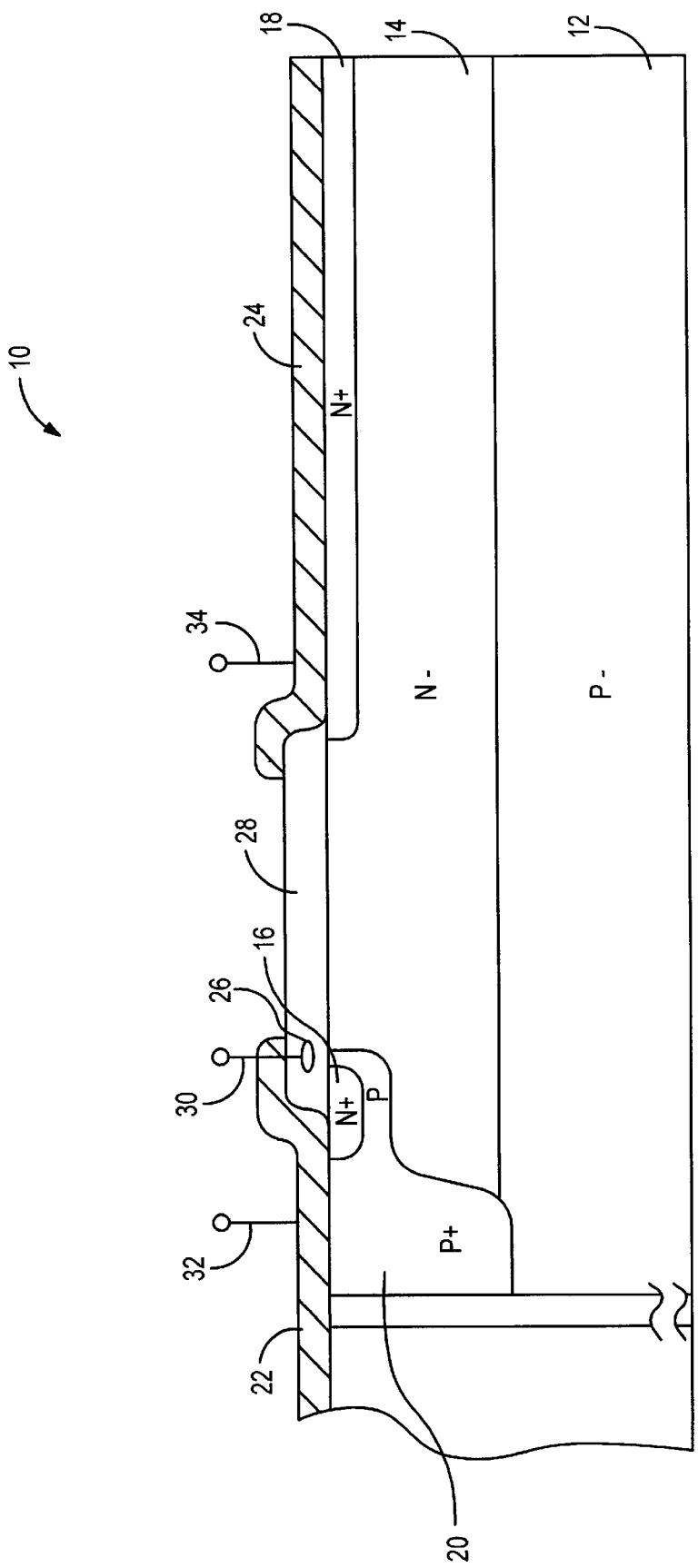
FIG. 1 is a cross-sectional view of a conventional lateral DMOS transistor.

The lateral DMOS transistor 38 of the semiconductor device 36 includes the components of a conventional lateral DMOS transistor, such as the lateral DMOS transistor 10 of FIG. 1. Therefore, the same reference numerals of FIG. 1 will be used for the same components depicted in FIG. 2. The lateral DMOS transistor 38 includes the lightly doped N-type region 14 that is formed over the P-type substrate 12. The lateral DMOS transistor further includes the heavily doped N-type source region 16, the heavily doped N-type drain region 18, and the P-type body region 20 that are formed in the lightly doped N-type region 14. In addition, the lateral DMOS transistor includes the two metallization layers 22 and 24 and the insulation layer 28. Located within the insulation layer is the gate 26 of the transistor. The metallization layer 22 is conductively attached to the P-type body region 20 and the heavily doped N-type source region 16. The metallization layer 22 provides a conduction between the source-body terminal 32 to the P-type body region 20 and the heavily doped N-type source region 16. The metallization layer 24 is conductively attached to the heavily doped N-type drain region 18. The metallization layer 24 provides a conduction between the drain terminal 34 and the heavily doped N-type drain region 18.

The minority-carrier injector 40 of the semiconductor device 36 is a P-type region formed in the lightly doped N-type region 14. The injector is located adjacent to the drain region 18, so that injected minority carriers can be introduced into the lightly doped N-type region in the vicinity of the current path 44. The exact location of the minority-carrier injector is not critical to the invention.

The integrated photodetector 42 of the semiconductor device 36 includes two photodiodes 46 and 48. The photodetector can be formed in an area that would have been a part of a drain region of a conventional lateral DMOS transistor, such as the drain region 18 of the DMOS transistor 10 of FIG. 1. The relatively large width of the drain region 18, as shown in FIG. 1, is required because of the large radius of curvature needed to obtain a high breakdown voltage as well as the need to place a bonding pad above the drain region. In a conventional lateral DMOS transistor structure, the center of the drain region is not utilized for active devices, and as such, is "wasted" area. The semiconductor device 36 utilizes this "wasted" area to form the photodiodes 46 and 48, as shown in FIG. 2.

The photodiodes 46 and 48 of the photodetector 42 are electrically isolated from the drain region 18 of the lateral DMOS transistor 38. The electrical isolation can be achieved by forming an oxide barrier around each photodiode of the photodetector. The photodiode 46 includes a P-type region 50 and an N-type region 52 that are formed on a P-type substrate 54. The P-type region 50 is electrically coupled to the minority-carrier injector 40 by a metallization layer 56. The photodiode 48 also includes a P-type region 58 and an N-type region 60 that are formed on a P-type substrate 62. The P-type region 58 of the photodiode 48 is electrically connected to the N-type region 52 of the photodiode 46 by a metallization layer 64. Therefore, the photodiodes 46 and 48 are serially coupled devices. The N-type region 60 of the photodiode 48 is electrically connected to the terminal 34 via a metallization layer 66. Thus, the photodetector 42 is referenced to the voltage applied to the drain region 18 of the DMOS transistor. Although the photodetector 42 is shown in FIG. 2 to be comprised of two electrically isolated photodiodes, the photodetector may be configured to include additional photodiodes, depending on the desired voltage (or current) to be applied to the minority-carrier injector 40.

Based on the power output curve of a typical photodetector, two devices such as the photodiodes 46 and 48 produce a maximum current with an output voltage of about 0.8 volts. The current that is produced by the photodetector 42, and hence injected to reduce the on-resistance of the lateral DMOS transistor 38, is proportional to the surface area of the photodiodes. This surface area can be adjusted to minimize the size of the semiconductor device 36 for a given on-resistance.

In operation, the photodiodes 46 and 48 of the photodetector 42 are exposed to incident light, when it is desired to lower the on-resistance of the lateral DMOS transistor 38. The photodiodes absorb the incident light and generate photocurrent, which is transmitted to the minority-carrier injector 40 of the device via the metallization layer 56, thereby causing the injector to be forward-biased. Since the photodetector is electrically connected to the drain region 18 of the DMOS transistor 38, the voltage at the injector is maintained at a two diode drop above the voltage at the drain region, even if the drain voltage is fluctuating. The forward-bias condition induces the injector to introduce minority carriers into the lightly doped N-type region 14 of the transistor, which lowers the on-resistance of the transistor.

Figure 3:
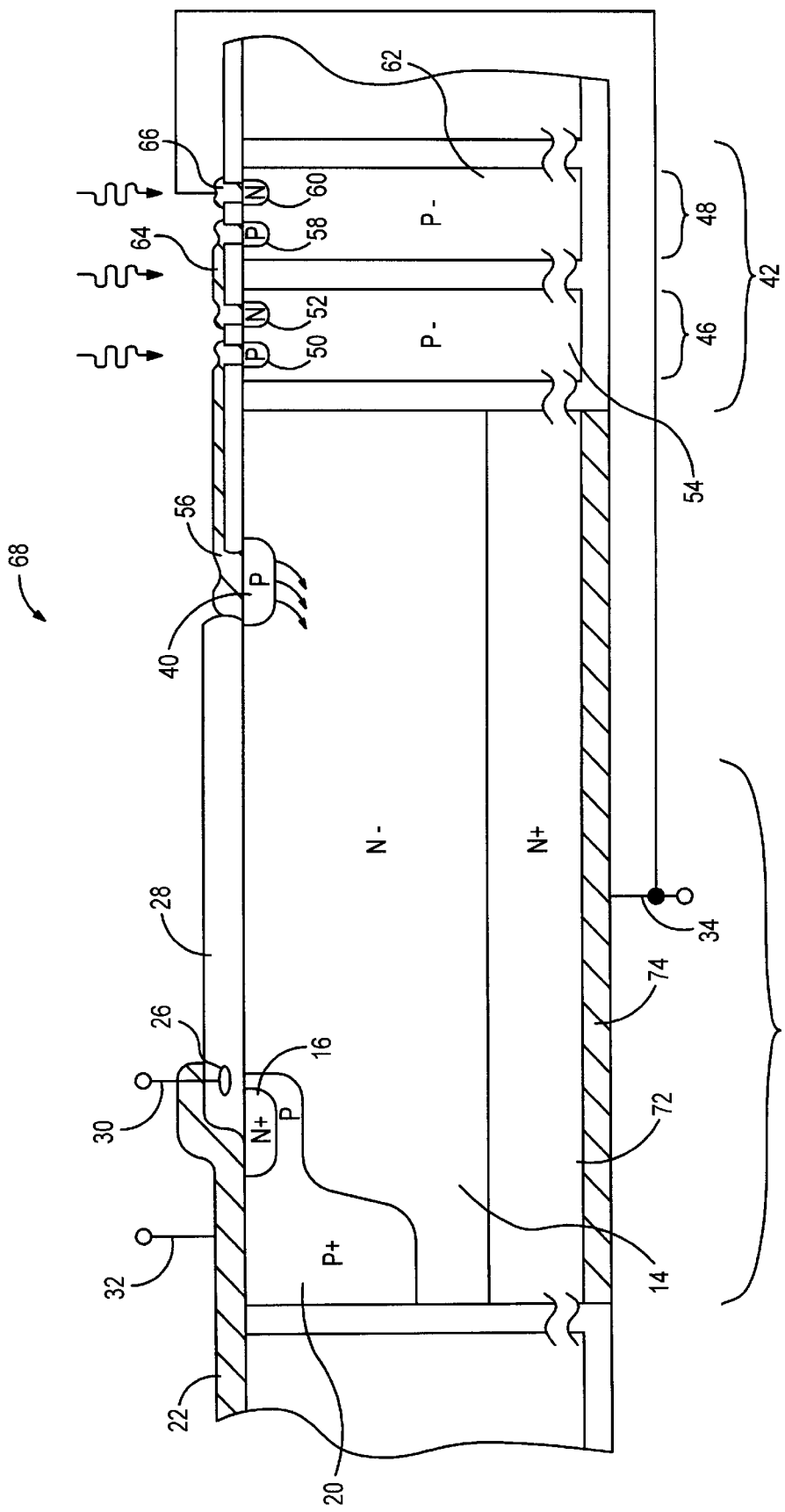
FIG. 3 is a cross-sectional view of a semiconductor device having a vertical DMOS transistor, a minority-carrier injector and an integrated photodetector in accordance with a second embodiment of the invention.

Turning now to FIG. 3, a semiconductor device 68 in accordance with a second embodiment is shown. Similar to the semiconductor device 36 of FIG. 2, the semiconductor device 68 also includes the minority-carrier injector 40 and the photodetector 42. However, the semiconductor device 68 differs from the semiconductor device 36 of FIG. 2 in that the semiconductor device 68 includes a vertical DMOS transistor 70, instead of a lateral DMOS transistor. The same reference numerals of FIG. 2 will be used for the same components depicted in FIG. 3.

The vertical DMOS transistor 70 of the device 68 includes a heavily doped N-type drain region, located below the lightly doped N-type region 14. The vertical DMOS transistor further includes the heavily doped N-type source region 16 and the P-type body region 20 that are formed in the lightly doped N-type region, opposite to the drain region 72. In addition, the vertical DMOS transistor includes an upper metallization layer 22, a lower metallization layer 74 and the insulation layer 28. Located within the insulation layer is the gate 26 of the transistor 70. The upper metallization layer 22 is conductively attached to the P-type body region 20 and the heavily doped N-type source region 16. The upper metallization layer provides a conduction between the source-body terminal 32 to the P-type body region 20 and the heavily doped N-type source region 16. The lower metallization layer 74 is conductively attached to the heavily doped N-type drain region 72. The lower metallization layer 24 provides a conduction between the drain terminal 34 and the heavily doped N-type drain region 72.

The minority-carrier injector 40 and the photodetector 42 of the semiconductor device 68 are structurally identical to the minority-carrier injector 40 and the photodetector 42 of the semiconductor device 36 of FIG. 2. Thus, the semiconductor device 68 operates essentially in the same manner as the semiconductor device 36 of FIG. 2. The minority-carrier injector 40 of the semiconductor device 68 is a P-type region formed in the lightly doped N-type region 14. The injector operates to introduce minority carriers into the lightly doped N-type region when subjected to a forward-bias condition. The introduction of the minority carriers results in a decrease in the on-resistance of the vertical DMOS transistor 70. The injector is electrically connected to the drain region 72 of the vertical DMOS transistor 70 via the metallization layer 74, so that the voltage on the injector, resulting from photocurrent generated by the photodetector 42, is maintained at a higher voltage than the voltage applied to the drain region 72 of the vertical DMOS transistor 70.

The integrated photodetector 42 of the semiconductor device 68 includes the two photodiodes 46 and 48. The photodiode 46 includes the P-type region 50 and the N-type region 52 that are formed on the P-type substrate 54. The P-type region 50 is electrically coupled to the minority-carrier injector 40 by the metallization layer 56. The photodiode 48 includes the P-type region 58 and the N-type region 60 that are formed on the P-type substrate 62. The P-type region 58 of the photodiode 48 is electrically connected to the N-type region 52 of the photodiode 46 by a metallization layer 64. The photodetector may include additional photodiodes, depending on the desired voltage (or current) to be applied to the minority-carrier injector 40. The number of photodiodes included in the photodetector is not critical to the invention.

Figure 4:
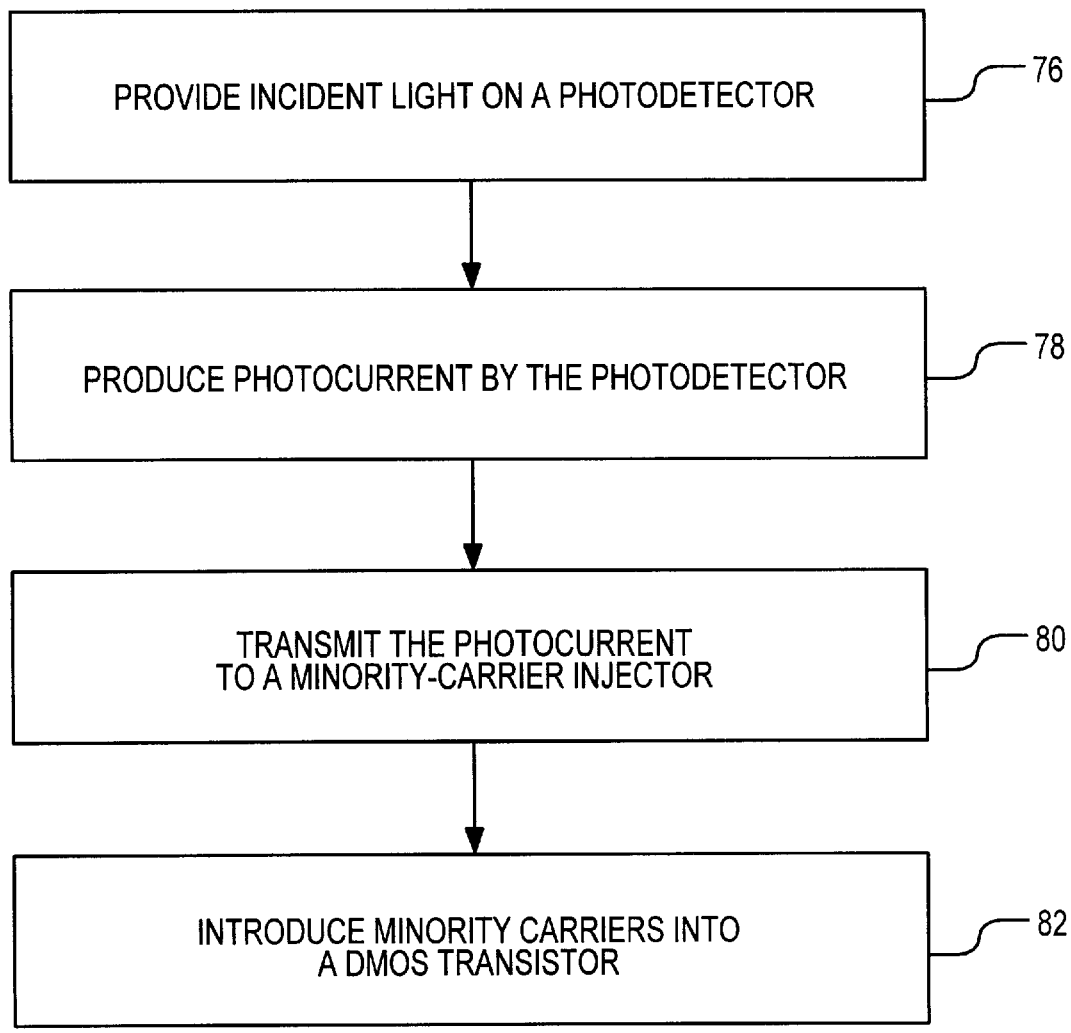
FIG. 4 is a flow diagram of a method of modulating the conductivity of a DMOS transistor in accordance with the invention.

A method of modulating the conductivity of a DMOS transistor of an integrated semiconductor device in accordance with the present invention will be described with reference to FIG. 4. The method begins at step 76, during which incident light is provided on the surface of a photodetector of a semiconductor device. As an example, the photodetector may include two serially connected photodiodes that are dielectrically isolated from the transistor. The incident light may be provided by an LED that is positioned near the surface of the photodetector. During step 78, the photodiodes of the photodetector produce photocurrent in response to the incident light. The photocurrent is then transmitted to a minority-carrier injector that is positioned near the DMOS transistor, during step 80. The transmitted current creates a forward-bias condition that induces the injector to introduce minority carriers into a drift region of the DMOS transistor, during step 82. The introduction of minority carriers within the drift region affects the conductivity of the DMOS transistor.

What is claimed is:

1. A semiconductor structure comprising:
    a transistor formed on a semiconductive substrate, said transistor having a first terminal region and a second terminal region that provide a current path when said transistor is in a conductive state;
    injecting means located proximate to said second terminal region of said transistor for introducing minority carriers to said transistor when subjected to a specified voltage condition; and
    an optoelectronic device electrically connected to said injecting means to provide injection voltage to said injecting means in response to incident light, said injection voltage inducing said specified voltage condition so that said injecting means introduces said minority carriers in a vicinity of said second terminal region of said transistor.

2. The structure of claim 1 wherein said optoelectronic device includes a photodiode that generates photocurrent in response to said incident light, said photocurrent being used to provide said injection voltage for said injecting means.

3. The structure of claim 2 wherein said photodiode of said optoelectronic device is a member of a plurality of photodiodes that are included in said optoelectronic device, said photodiodes being serially connected to said injecting means.

4. The structure of claim 2 wherein said photodiode of said optoelectronic device is electrically coupled to said second terminal region of said transistor such that said optoelectronic device is referenced to a voltage applied to said second terminal region.

5. The structure of claim 1 wherein said injecting means includes an injection region that is coupled to said optoelectronic device to receive said injection voltage, said injection region being a conductivity type that is opposite to a conductivity type of said second terminal region of said transistor.

6. The structure of claim 1 wherein said transistor is a metal-oxide-semiconductor (MOS) transistor such that said first terminal region is a source of said MOS transistor and said second terminal region is a drain of said MOS transistor.

7. The structure of claim 6 wherein said MOS transistor is a double-diffused MOS transistor such that said source is formed in a diffused region of said semiconductive substrate.

8. The structure of claim 7 wherein said double-diffused MOS transistor is a lateral double-diffused MOS transistor such that said drain and said source are located on a common surface of said semiconductive substrate.

9. The structure of claim 7 wherein said double-diffused MOS transistor is a vertical double-diffused MOS transistor such that said drain and said source are located on opposed surfaces of said semiconductive substrate.

10. The structure of claim 1 wherein said optoelectronic device is formed on said semiconductive substrate such that said transistor and said optoelectronic device are integrated on said semiconductive substrate.

11. A method of modulating conductivity of a transistor comprising steps of:

providing incident light on a photodetector;

producing a photo-induced current by said photodetector in response to said incident light;

transmitting said photo-induced current to an injector located proximate to said transistor; and introducing minority carriers into said transistor by said injector in response to said photo-induced current, said minority carriers affecting said conductivity of said transistor.

12. The method of claim 11 wherein said step of producing said photo-induced current includes a step of generating said photo-induced current by at least one photodiode included in said photodetector.

13. The method of claim 11 further comprising a step of creating a forward-bias condition by subjecting said injector to an injection voltage that is dependent on said photo-induced current, said injector being induced to introduce said minority carriers by said forward-bias condition.

14. The method of claim 13 further comprising a step of referencing said photodetector to a transistor voltage applied to an electrode of said transistor, so that said injection voltage is maintained above said transistor voltage.

15. The method of claim 11 wherein said step of introducing said minority carriers is a step of introducing said minority carriers into a drift region of a double-diffused metal-oxide-semiconductor transistor.

16. The method of claim 11 wherein said step of producing said photo-induced current and said step of introducing said minority carriers are executed on a single semiconductive chip that includes said photodetector, said injector and said transistor.

17. A conductivity-modulated device comprising:

a semiconductive substrate;

a transistor formed on said semiconductive substrate;

an injector located adjacent to an electrode region of said transistor, said injector being composed of a material to generate minority carriers when subjected to a voltage condition; and a photodetector electrically connected to said injector, said electrical connection providing an injection voltage to said injector when exposed to incident light, said injection voltage inducing said injector to introduce said minority carriers in a vicinity of said electrode region of said transistor, said minority carriers being used to control the conductivity of said transistor.

18. The device of claim 17 wherein said photodetector includes at least one photodiode that can generate photocurrent in response to incident light.

19. The device of claim 17 wherein said photodetector is electrically connected to said electrode region of said transistor such that said photodetector is referenced to a voltage applied to said electrode region.

20. The device of claim 17 wherein said transistor is a double-diffused transistor, said electrode region being a drain region of said double-diffused transistor.

21. The device of claim 17 wherein said transistor and said photodetector are integrated devices that are formed on said semiconductive substrate.

* * * * *